(12) United States Patent
Mathur

(10) Patent No.: US 8,560,999 B2
(45) Date of Patent: Oct. 15, 2013

(54) ROUTING

(75) Inventor: Sachin Mathur, Uttar Pradesh (IN)

(73) Assignee: STMicroelectronics International N. V., Amsterdam (NL)

(*) Notice: Subject to any disclaimer, the term of this patent is extended or adjusted under 35 U.S.C. 154(b) by 181 days.

(21) Appl. No.: 12/982,570

(22) Filed: Dec. 30, 2010

(65) Prior Publication Data

US 2012/0174052 A1   Jul. 5, 2012

(51) Int. Cl.
   *G06F 17/50*   (2006.01)
(52) U.S. Cl.
   USPC .................... 716/126; 716/108; 716/134
(58) Field of Classification Search
   USPC .......... 716/100, 106–108, 110–113, 126, 134
   See application file for complete search history.

(56) References Cited

U.S. PATENT DOCUMENTS

| | | | |
|---|---|---|---|
| 7,412,680 B1* | 8/2008 | Gouterman et al. | 716/126 |
| 7,493,583 B1* | 2/2009 | Weiss | 716/30 |
| 2006/0031798 A1* | 2/2006 | Dirks et al. | 716/6 |

* cited by examiner

*Primary Examiner* — Paul Dinh
(74) *Attorney, Agent, or Firm* — Wolf, Greenfield & Sacks, P.C.

(57) ABSTRACT

A method for designing an electronic circuit including determining at least one hold violation in a net routing; inserting a routing blockage associated with each at least one hold violation; de-routing the determined net-routing and re-routing the determined net-routing dependent on at least the routing blockage.

39 Claims, 7 Drawing Sheets

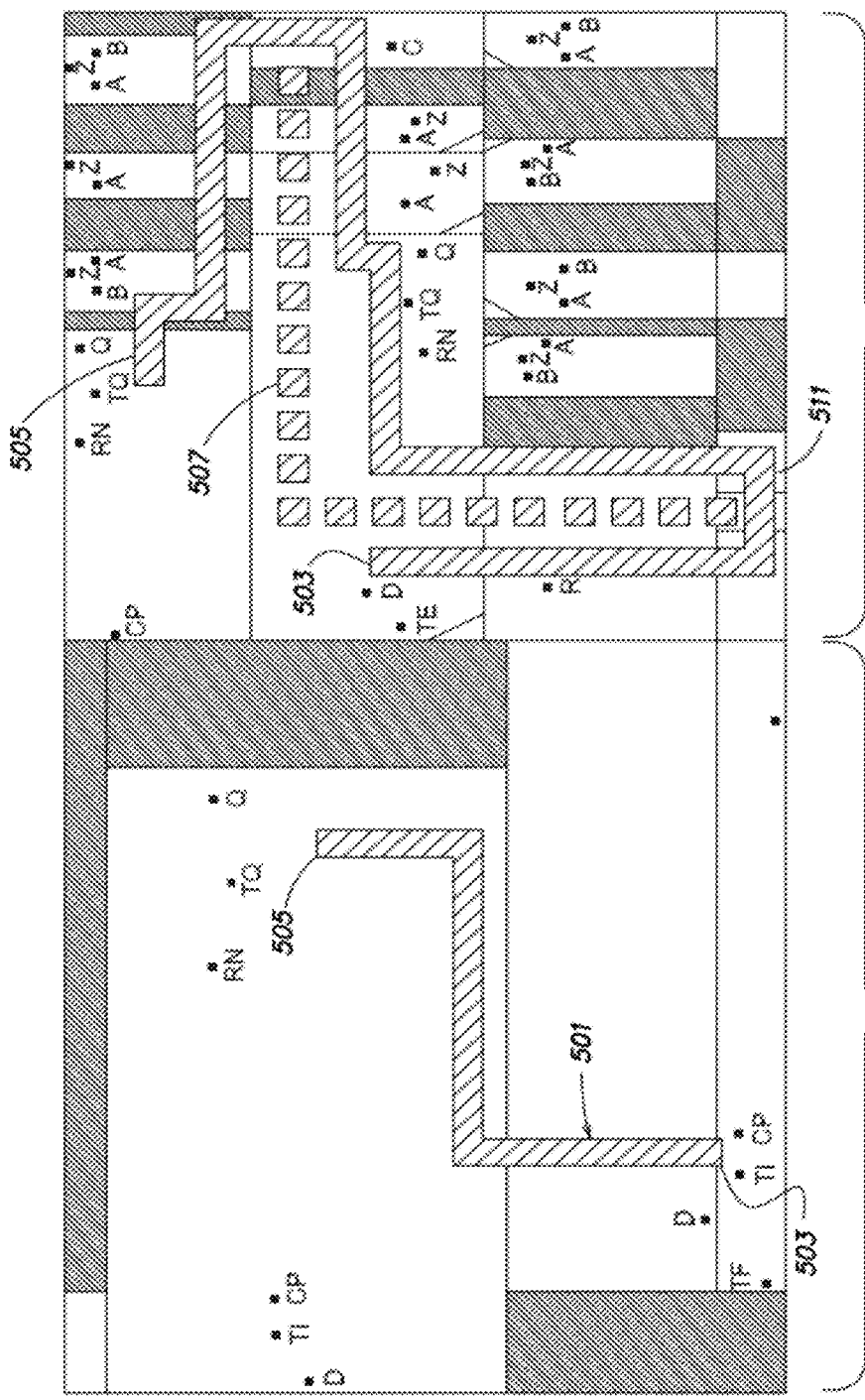

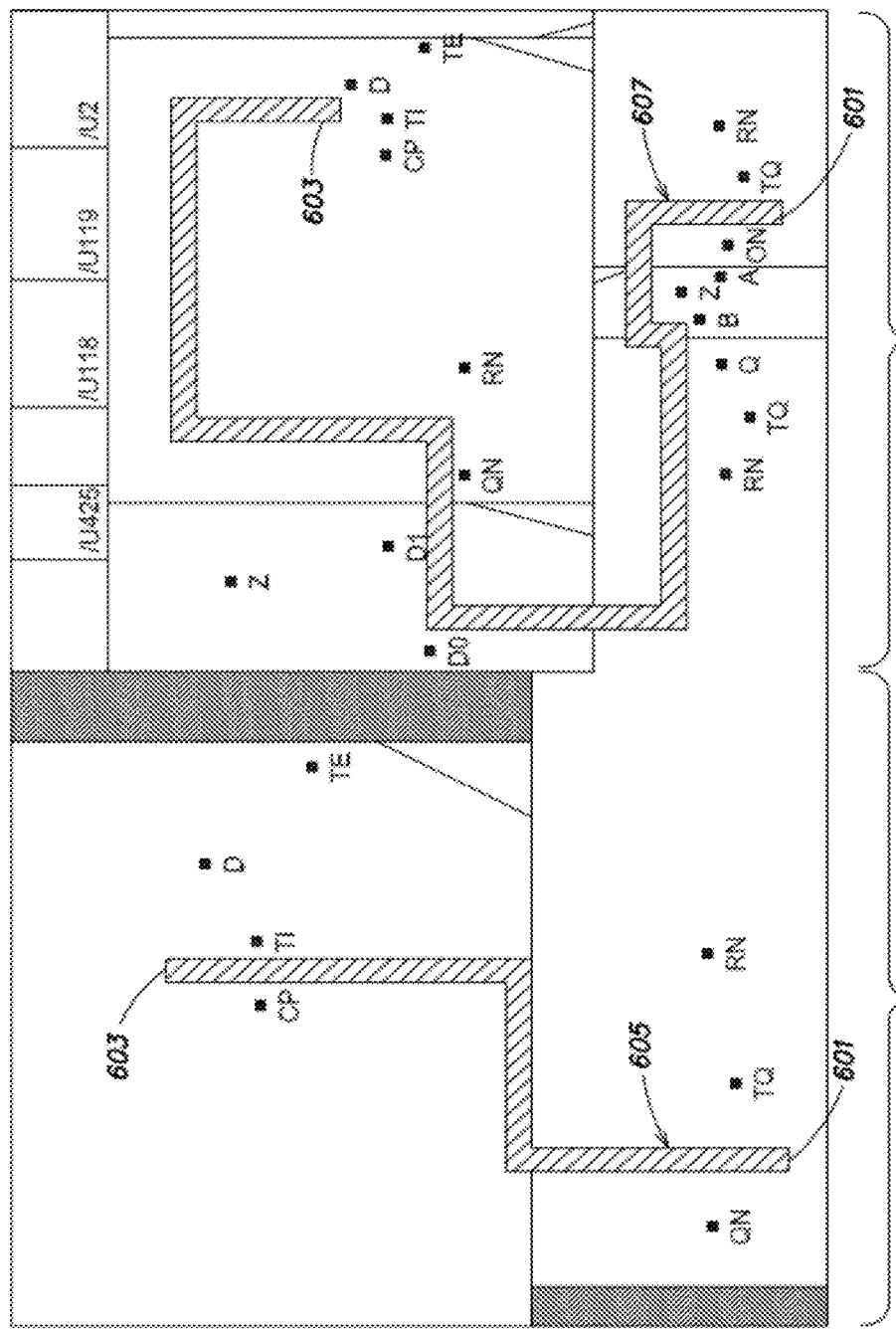

ROUTING

BACKGROUND OF THE INVENTION

1. Field of the Invention

The present invention relates to circuit routing, for example, but not exclusively to routing an integrated circuit.

2. Discussion of the Related Art

Electronic Design Automation (EDA) is the use of a series of tools to assist the creation of circuits such as integrated circuits (IC) or field programmable gate array (FPGA) circuits. These tools can assist automation of the design process and can attempt to produce a global optimization of the routing and positioning of the elements and components of the circuit under design. However on chip variations (OCV) require that the designs have 'pessimism' introduced to account for any variations in the integrated circuit. Also pessimism is introduced to account for any correlation differences between the tools used for implementation and Signoff. These 'pessimism' elements can be considered to be for example a series of extra margins such as increased uncertainties and derations applied to timings.

Furthermore as circuits are designed using smaller components the extra margins required increases as, for example hold violations, examples where output data is not held for long enough and may pass through multiple stages and thus destroy signal integrity at a later stage or process, relatively increase. For example in 65 nm process technology we have approximately 5% deration on launch/capture clock components, and 10% data deration whereas for a 32 nm process the occurrences are 6% deration on launch/capture clock and 18% data deration. These figures may vary for different processes and different foundries.

Typically hold violations are targeted during the design stage by adding additional buffer or delay elements. However such approaches have problems such as degrading the set-up time, creating congestion hot-spots, increasing overall design utilization, increased cycle time for design closure and possible voltage drop across the circuit also known as IR drop caused by the additional components.

Furthermore although a significant number of hold violations violate the timing constraints by only a few picoseconds the buffers typically add a much greater delay than is required. For example a buffer in 65 nm process technology can generate a 20-25 ps delay and be used to implement a delay for a hold violation of as little as 1 ps.

Other proposed methods to fix hold time violations are to increase wire length by scan chain reordering, or to reorder the scan chain depending upon local clock skew which favours hold time. However these methods can only be applied to shift mode hold violations and so are not suitable for other modes of operation such as functional modes of operation, built in self test modes of operation or capture modes.

SUMMARY OF THE INVENTION

It is an aim of embodiments of the present application to overcome these problems by providing routing resources where nets connected to hold time violating endpoints are slightly blocked, thus forcing the net connected to the endpoint to take a detour. By generating nets with detours and thereby increasing the impedance-capacitance (RC) constant on the net it can be possible to fix hold violation and reduce the total negative slack (TNS) for Hold.

According to one aspect, there is provided a method for designing an electronic circuit comprising: determining at least one hold violation in a net routing, inserting a routing blockage associated with each at least one hold violation, de-routing the determined net-routing; and re-routing the determined net-routing dependent on at least the routing blockage.

Determining a hold violation in a net routing may comprise determining a small hold violation in a net routing.

A small hold violation may be at least one of: a 0-20 ps hold violation; and a 20-30 ps hold violation.

Inserting a routing blockage may comprise at least one of: inserting a fixed dimension routing blockage; inserting a routing blockage with dimensions dependent on the hold violation timing; inserting a routing blockage dependent on information about the net routing topology; and inserting a routing blockage dependent on information about the net routing technology.

Inserting a routing blockage may comprise inserting a routing blockage with length and width dimensions.

The method may further comprise: determining a potential routing blockage location for the routing blockage; determining the routing blockage at the potential routing blockage location has a minimum distance from at least one other routing blockage at a second potential routing blockage location; and associating the potential routing blockage location with the routing blockage.

The method may further comprise removing the routing blockages after re-routing the net-routing.

The method may further comprise: determining at least one secondary hold violation in a net routing after re-routing the net-routing.

The method may further comprise: inserting a secondary routing blockage associated with each at least one secondary hold violation, wherein the secondary routing blockage has dimensions greater than the routing blockage associated with the net-routing; de-routing the determined net-routing; and re-routing the net-routing dependent on at least the secondary routing blockage.

The method may further comprise inserting a timing buffer in the secondary hold violation net routing pathway.

According to another aspect, there is provided an electronic circuit designer comprising: a routing analyzer configured to determine at least one hold violation in a net routing; a routing inserter configured to insert a routing blockage associated with each at least one hold violation; a routing deleter configured to de-route the determined net-routing; and a router configured to re-route the determined net-routing dependent on at least the routing blockage.

The routing analyzer may comprise a small hold violation determiner configured to determine a small hold violation in a net routing.

The small hold violation may be at least one of: a 0-20 ps hold violation; and a 20-30 ps hold violation.

The routing inserter may comprise at least one of: a fixed dimension routing inserter configured to insert a fixed dimension routing blockage; a variable dimension routing inserter configured to insert a routing blockage with dimensions dependent on the hold violation timing; a topology dependent routing inserter configured to insert the routing blockage dependent on information about the net routing topology; and a technology dependent routing inserter configured to insert a routing blockage dependent on information about the net routing technology.

The routing inserter may be configured to insert a routing blockage with at least length and width dimensions.

The electronic circuit designer may further comprise: a routing insert locator configured to determine a potential routing blockage location for the routing blockage; a routing insert proximity detector configured to determine the routing blockage at the potential routing blockage location has a minimum distance from at least one other routing blockage at a second potential routing blockage location; and a routing insert linker configured to associate the potential routing blockage location with the routing blockage.

The electronic circuit designer may further comprising a routing blockage remover configured to remove the routing blockage after re-routing the net-routing.

The routing analyzer may be further configured to determine at least one secondary hold violation in a net routing after re-routing the net-routing.

The routing inserter may be further configured to insert a secondary routing blockage associated with each at least one secondary hold violation, wherein the secondary routing blockage has dimensions greater than the routing blockage associated with the net-routing.

The routing deleter may be further configured to de-route the determined net-routing.

The router may be further configured to re-routing the net-routing dependent on at least the secondary routing blockage.

The electronic circuit designer may further comprise a buffer inserter configured to insert a timing buffer in the secondary hold violation net routing.

According to another aspect there is provided a computer-readable storage medium encoded with instructions that, when executed by a computer, perform: determining at least one hold violation in a net routing; inserting a routing blockage associated with each at least one hold violation, de-routing the determined net-routing; and re-routing the determined net-routing dependent on at least the routing blockage.

Determining a hold violation in a net routing may cause the computer to perform determining a small hold violation in a net routing.

A small hold violation may be at least one of: a 0-20 ps hold violation; and a 20-30 ps hold violation.

Inserting a routing blockage may cause the computer to perform at least one of: inserting a fixed dimension routing blockage; inserting a routing blockage with dimensions dependent on the hold violation timing; inserting a routing blockage dependent on information about the net routing topology; and inserting a routing blockage dependent on information about the net routing technology.

Inserting a routing blockage may cause the computer to perform inserting a routing blockage with length and width dimensions.

The computer-readable storage medium may be further encoded with instructions that, when executed by a computer, performs: determining a potential routing blockage location for the routing blockage; determining the routing blockage at the potential routing blockage location has a minimum distance from at least one other routing blockage at a second potential routing blockage location; and associating the potential routing blockage location with the routing blockage.

The computer-readable storage medium may be further encoded with instructions that, when executed by a computer, performs removing the routing blockages after re-routing the net-routing.

The computer-readable storage medium may be further encoded with instructions that, when executed by a computer, performs determining at least one secondary hold violation in a net routing after re-routing the net-routing.

The computer-readable storage medium may be further encoded with instructions that, when executed by a computer, performs inserting a secondary routing blockage associated with each at least one secondary hold violation, wherein the secondary routing blockage has dimensions greater than the routing blockage associated with the net-routing; de-routing the determined net-routing; and re-routing the net-routing dependent on at least the secondary routing blockage.

The computer-readable storage medium may be further encoded with instructions that, when executed by a computer, performs inserting a timing buffer in the secondary hold violation net routing pathway.

According to another aspect there is provided an apparatus comprising at least one processor and at least one memory including computer program code the at least one memory and the computer program code configured to, with the at least one processor, cause the apparatus at least to perform: determining at least one hold violation in a net routing; inserting a routing blockage associated with each at least one hold violation, de-routing the determined net-routing; and re-routing the determined net-routing dependent on at least the routing blockage.

Determining a hold violation in a net routing may cause the apparatus to perform determining a small hold violation in a net routing.

A small hold violation may be at least one of: a 0-20 ps hold violation; and a 20-30 ps hold violation.

Inserting a routing blockage may cause the apparatus to perform at least one of: inserting a fixed dimension routing blockage; inserting a routing blockage with dimensions dependent on the hold violation timing; inserting a routing blockage dependent on information about the net routing topology; and inserting a routing blockage dependent on information about the net routing technology.

Inserting a routing blockage may cause the apparatus to perform inserting a routing blockage with length and width dimensions.

The apparatus may further perform: determining a potential routing blockage location for the routing blockage; determining the routing blockage at the potential routing blockage location has a minimum distance from at least one other routing blockage at a second potential routing blockage location; and associating the potential routing blockage location with the routing blockage.

The apparatus may further perform removing the routing blockages after re-routing the net-routing.

The apparatus may further perform determining at least one secondary hold violation in a net routing after re-routing the net-routing.

The apparatus may further perform inserting a secondary routing blockage associated with each at least one secondary hold violation, wherein the secondary routing blockage has dimensions greater than the routing blockage associated with the net-routing; de-routing the determined net-routing; and re-routing the net-routing dependent on at least the secondary routing blockage.

The apparatus may further perform inserting a timing buffer in the secondary hold violation net routing pathway.

According to another aspect there is provided apparatus comprising: means for determining at least one hold violation in a net routing; means for inserting a routing blockage associated with each at least one hold violation; means for de-routing the determined net-routing; and means for re-routing the determined net-routing dependent on at least the routing blockage.

The means for determining a hold violation in a net routing may comprise means for determining a small hold violation in a net routing.

A small hold violation may be at least one of: a 0-20 ps hold violation; and a 20-30 ps hold violation.

The means for inserting a routing blockage may comprise at least one of: means for inserting a fixed dimension routing blockage; means for inserting a routing blockage with dimensions dependent on the hold violation timing; means for inserting a routing blockage dependent on information about the net routing topology; and means inserting a routing blockage dependent on information about the net routing technology.

The means for inserting a routing blockage may comprise means for inserting a routing blockage with length and width dimensions.

The apparatus may further comprise: means for determining a potential routing blockage location for the routing blockage; means for determining the routing blockage at the potential routing blockage location has a minimum distance from at least one other routing blockage at a second potential routing blockage location; and means for associating the potential routing blockage location with the routing blockage.

The apparatus may further comprise means for removing the routing blockages after re-routing the net-routing.

The apparatus may further comprise means for determining at least one secondary hold violation in a net routing after re-routing the net-routing.

The apparatus may further comprise: means for inserting a secondary routing blockage associated with each at least one secondary hold violation, wherein the secondary routing blockage has dimensions greater than the routing blockage associated with the net-routing; means for de-routing the determined net-routing; and means for re-routing the net-routing dependent on at least the secondary routing blockage.

The apparatus may further comprise means for inserting a timing buffer in the secondary hold violation net routing pathway.

BRIEF DESCRIPTION OF THE DRAWINGS

Reference will be made by way of example only to the accompanying drawings in which:

FIGS. 6a and 6b show a further example of re-routing a small hold violation net routing using a 2-dimensional blockage; and FIGS. 7a and 7b show an additional example of re-routing a small hold violation net routing using a further 2-dimensional blockage.

DETAILED DESCRIPTION

This disclosure describes apparatus and methods for a method for hold fixing, where the number of buffers used to fix hold time violations in a design can be reduced. The embodiments of the application aim to produce an improvement over the present approaches by blocking routing resources for nets connected to hold time violating endpoints, thus forcing the net connected to the endpoint to take a detour. In doing so the RC is increased on the re-routed net, which can in some examples fix the hold violation and furthermore can reduce the total negative slack (TNS).

Figure 1:
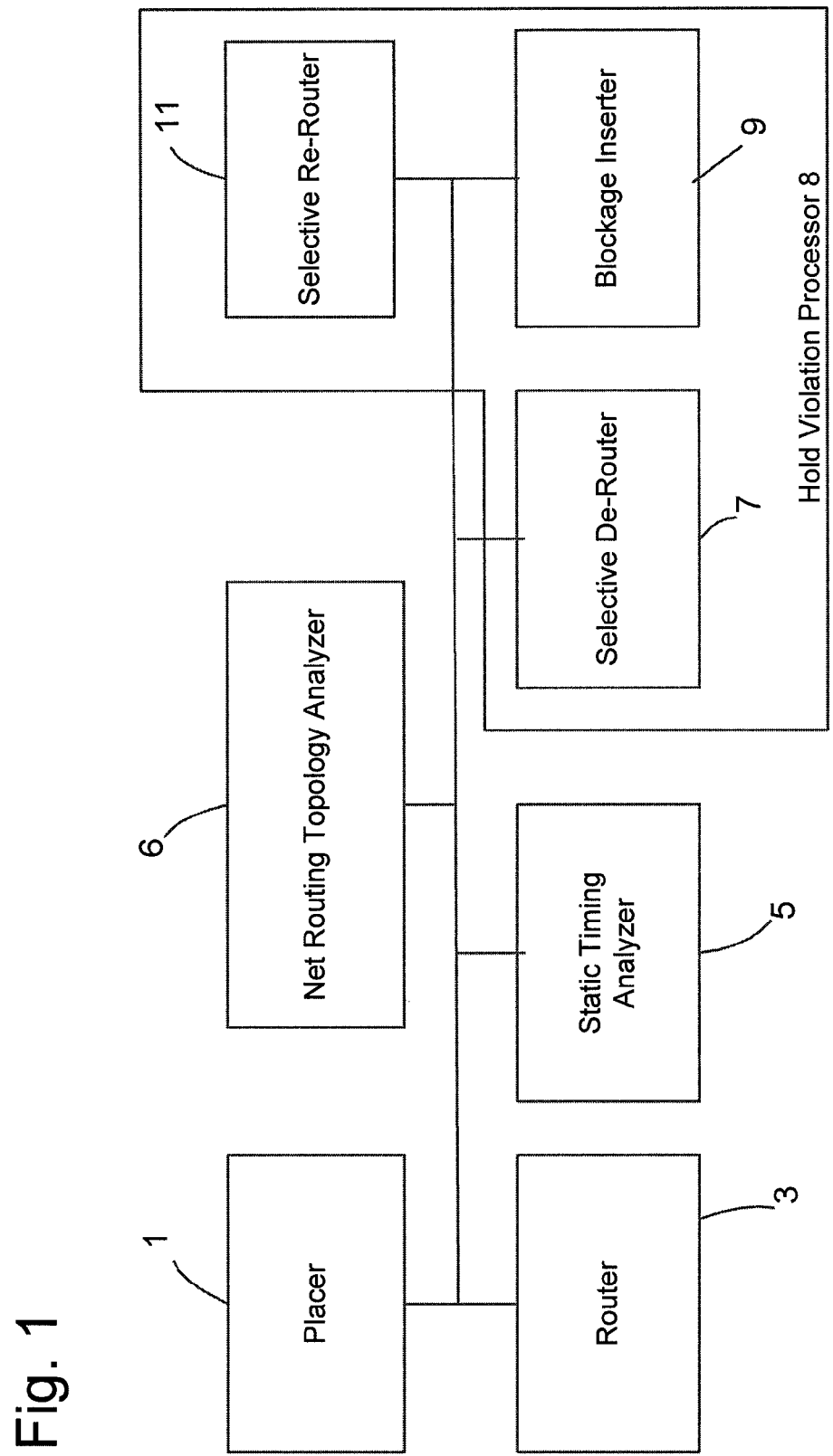
FIG. 1 shows schematically a circuit designer according to some embodiments of the application.

With respect to FIG. 1, a schematic circuit design apparatus is shown with respect to embodiments of the application. Furthermore with respect to FIG. 2, a flow diagram of the operation of the circuit design apparatus according to some embodiments of the application is shown. The circuit design apparatus and operation of the circuit design apparatus is described herein in such a way to clearly explain the operation of the embodiments of the application, however the operations of the placer, router and static timing analyzer are generally known and will not be described in detail. Furthermore the following examples are described with respect to an integrated circuit version of the circuit design apparatus. It would be appreciated that in some other embodiments the same elements and operations can be applied to other circuit design apparatus versions, such as for example FPGA circuit design.

In some embodiments there can comprise a net routing topology analyzer 6 which is configured to store the series of design rules and process variation configuration or parameters associated with the fabrication and/or design technology being used. The net routing topology analyzer 6 can further therefore output the rules to other components of the designer such as for example the router 3, the selective de-router 7, the blockage inserter 9, and the selective re-router 11.

The circuit design apparatus can, in some embodiments, comprise a placer 1. The placer 1 is configured to assign locations for various circuit components within the integrated circuit core area. In some embodiments the objective of the placer 1 can comprise locating the circuit components while achieving objectives such as, minimizing the total wire length, minimizing the sum of the length of all of the wires in the design, ensuring that no signal path exists with a delay exceeding the maximum specified delay for timing, reducing congestion of possible routing resources, minimizing power consumption by distributing components so to reduce the overall power consumption, reducing hot spots, and to reduce the runtime requirement for the placing operation. The operation of placing is generally known and will not be described further.

Figure 2:
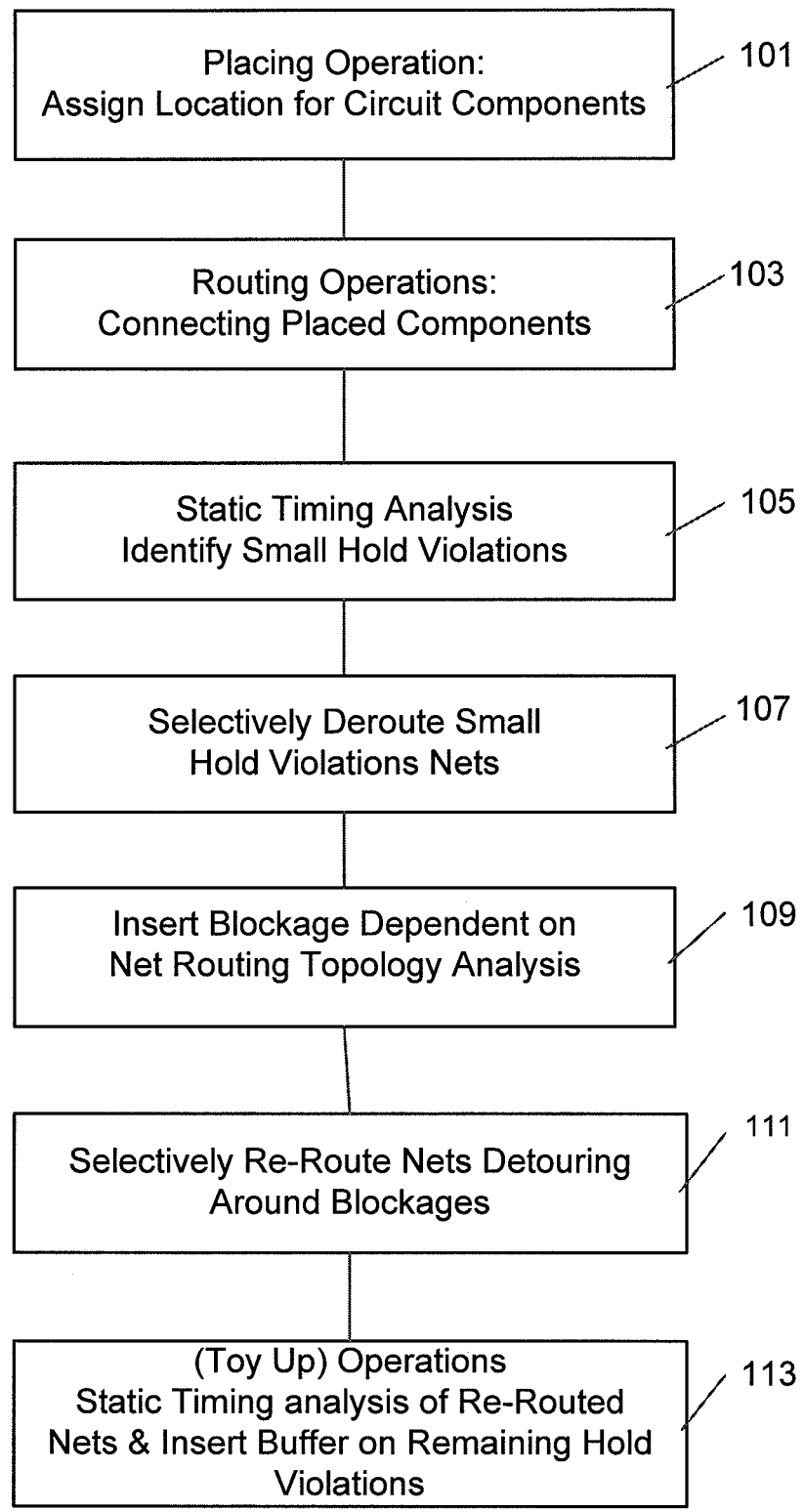
FIG. 2 shows a flow chart of the circuit designer operations according to some embodiments of the application.

The operation of placing, in other words assigning locations for circuit components is shown in FIG. 2 by step 101.

In some embodiments the circuit designer further comprises a router 3. The router 3 receives the placement configuration from the placer 1 and is configured to add wires required to properly connect the placed components whilst maintaining the design rules for the integrated circuit. The router 3 can for example be given pre-existing polygons comprising pins or terminals on cells. Each of these polygons are associated with a net, in other words a representation of a conductive path such as a wire, and the router creates geometries such that all of the terminals assigned to the same net are connected, no terminals assigned to different nets are connected and but all the design rules are obeyed. The router 3 can furthermore in some embodiments as described herein receive information with regards to the technology or net routing topology being used from the net routing topology analyzer 6.

The router is configured to output the net routing configuration together with the component placing configuration to the static timing analyzer 5.

The operation of routing, in other words connecting the placed components according to a set of design rules dependent on the technology used is shown in FIG. 2 by step 103.

The circuit design apparatus in some embodiments comprises a static timing analyzer 5. The static timing analyzer 5 is configured to receive the placement and routing information and determine whether the current placement and routing information obeys the current design rules according to the design technology being implemented. As high performance integrated circuits are characterized by the clock frequency at which they operate, the static timing analyzer 5 can be configured to determine where a hold time violation occurs in the current placement and routing configurations for a synchronous digital system. In other words, static timing analyzer 5 can, in some embodiments, be configured to determine where an input signal changes too quickly after the clock active transition. The static timing analyzer 5 is configured to output this information to the selective de-router 7. In some embodiments the information can comprise a list of nets which contain hold time violations within a specific range. For example in some embodiments the static timing analyzer 5 is configured to output a list of nets which have hold time violations in the range 0 to 20 picoseconds.

The operation of static timing analysis where small hold violations are identified is shown in FIG. 2 by step 105.

In some embodiments the placement, routing and hold violation information is passed to a hold violation processor 8. The hold violation processor 8 is configured in some embodiments to act on the information to attempt to reduce the need for buffer insertion by performing a routing blockage insertion, selective de-routing and selective re-routing. The hold violation processor 8 can be implemented on a computer or processor. Furthermore the computer or processor can comprise or be coupled in some embodiments to a memory, the memory containing a data section associated with data to be processed or having been processed by the processor and an instruction section containing processor instructions to be implemented on the processor for controlling the processor and operating on the data.

Thus in some embodiments the selective de-routing, blockage insertion and selective re-routing can be implemented as an algorithm written in TCL which takes as inputs all of the violating end points (and start points) and carries out the following operations.

1) Insert blockages for all violating endpoints in one step.
2) Delete and Reroute the nets on violating endpoints.
3) Delete the blockages added in step 1)
4) ECO Route the Design to fix any remaining violations (residual violation buffer insertion)
5) Freeze all the nets for hold fixed endpoints To assist in the understanding of the application the following examples describe that in some embodiments the hold violation processor 8 comprises a selective de-router 7, a routing blockage inserter 9 and a selective re-router 11.

In some embodiments, the circuit design apparatus comprises a selective de-router 7 configured to receive the output of the static timing analyzer 5. The selective de-router 7 is configured to selectively de-route any nets where a small hold violation has been determined. In other words the selective de-router 7 is configured to open up the pathway between any violating start and end points to enable a further routing to occur.

The selectively de-routing of small hold violation nets is shown in FIG. 2 by step 107.

In some embodiments, the circuit design apparatus comprises a blockage inserter 9. The blockage inserter 9 is configured to receive the information concerning the small hold violation nets. In some other embodiments, the blockage inserter 9 further receives information about the selectively de-routed nets. Furthermore the blockage inserter 9 is configured to receive information from the net routing topology analyzer 6 concerning the orientation of routing, and other technology based rules. In other words the blockage inserter can be configured to receive information of net routing topology only for the net connected to hold violating endpoint and not for other nets.

The blockage inserter 9 is configured in some embodiments to insert a routing blockage at a position between the terminals with small hold violation routings (which in some embodiments can be determined as being the nets which have been selectively de-routed) and with a sufficient minimum size dependent on the small hold violation timing information and the net routing topology analyzer results. Thus for example in some embodiments the blockage inserter 9 is configured to insert a routing blockage of size approximating to the small hold violation timing period that a signal could travel along the routing wire perpendicular to the connecting line between the terminals in order to introduce a routing blockage which requires a minimum length which has a signal pathway timing greater than the hold time violation period.

It would be understood that the signal speed is dependent on both the resistance of the wire and also the capacitance of the wire. An example of the estimation of the resistance of the wire can be shown by Formula: $R=\rho L/A$ where, $\rho$ is the resistivity of the metal, R is the overall resistance of the conductor, L is the length of the conductor, and A is the cross sectional area of conductor. It would be understood that the R value would depend not only on the length of the wire but also the technology used or planned to be used in fabrication. Hence as smaller features are used in advanced technology nodes, for example the move to feature sizes of 40 nm and 32 nm the wire delay would a more significant contributor to the total path delay.

In some embodiments the blockage inserter 9 can be configured to determine a minimum distance between routing blockages in order to prevent the routing blockages from interfering with each other and causing significantly greater blockages to be overcome. In some such embodiments the blockage inserter 9 can be configured to determine whether a new routing blockage is too close to any other neighbouring blockage and flag this new blockage if this occurs. In some such embodiments where there is no space to insert a routing blockage following the re-routing operation (and clean-up operation of removal of blockages) described herein the hold violation processor 8 can be configured to perform an additional cycle of blocking insertion for any flagged required block which was not processed.

This technique can also be applied in some embodiments on critical paths, as no more delay is inserted than required for hold fixing. Also in such embodiments the setup results are much better as compared to buffer insertion as shown by the results described hereafter. In some embodiments the user can be provided the flexibility to exclude some hold violating endpoints from detouring due to some design specific requirement. These endpoints can be excluded for example from a list of endpoints which is provided to the TCL algorithm for fixing.

In some embodiments the nets with hold violations can be processed in more than one iteration of the described operations to attempt to reduce the number of flagged routing blockage which 'too close' neighbouring routing blockages.

The routing blockage can be any suitable blockage, in other words in some embodiments the routing blockage can be a single dimensioned (in other words a line with a defined length), or two dimensioned (in other words any suitable polygon or lines with perpendicular axis dimensions of length and width). It would be understood that in technologies which can be implement routing with further dimensionality the routing blockage can also be further dimensionally defined.

In some embodiments the width and length of the blockage is a constant (8 µm blockage length and 0.1 µm width) for all small violations in the range 0 ps-20 ps. In such embodiments simulations have found that with blockages of 8 µm length, the average net length detour is 12 µm.

In some embodiments the detouring of the nets can be determined by the hold time violation requirement. For example in some embodiments a mapping table which maps a hold violation to a blockage size. Although it would be understood that a blockage which is 5 µm long would not necessarily generate a detour wire length of 5 µm and may be generally slightly more because the re-routing using existing routing resources and not moving the existing nets routing in design causes the re-routing tool to operate such that it may not be able to route the net along the blockage periphery.

Where the re-routing of the net is permitted to route along the blockage boundary (in the best case) then the re-routing can produce an accurately estimated delay in terms of wire length delay, however the net delay can also vary according to driver and load cells and also any cross talk effects from neighbouring nets which can make the delay re-routed net slow or fast as compared to the expected delay.

The embodiments where the blockage length is kept constant for a range of hold violations is acceptable as for small violations in range 20-30 ps the variation in blockage size would not be great and furthermore there can be a saving in the design run time for determining the blockage size considering all factors.

The operation of inserting a blockage dependent on the net routing topology analysis is shown in FIG. 2 by step 109.

In some embodiments the hold violation processor 8 can further comprise a selective re-router 11. The selective re-router 11 is configured in such embodiments to receive information concerning the routing blockage, and the hold violating net elements. In these embodiments the selective re-router 11 can be configured to selectively re-route a net between the terminals defined by the hold violating net and avoiding the inserted routing blockages.

The selective re-routing of the net detouring around any blockages is shown in FIG. 2 by step 111.

In some embodiments the blockage inserter 9 is then configured to, having determined that the selective re-router 11 has attempted a re-routing operation detouring around the routing block delete the blockage.

Furthermore in some embodiments the static timing analyzer 5 can perform a further static timing analysis of the re-routed nets. Any remaining hold violation nets can then be flagged or a flag maintained against the net.

In some embodiments, where there any remaining hold violations in any nets a further iteration of de-routing, inserting routing blockages, and re-routing detouring any blockages can be carried out. In some embodiments the remaining hold violations can be distinguished from the initial hold violations or the iteration number stored in such a way that subsequent or successively iteration flagged hold violations are processed by inserting routing blockages with successively longer dimensions.

In some embodiments any remaining or successive hold violations determined after performing a known number of de-routing, inserting routing blockage, and re-routing operations is processed by applying a buffers to delay the path sufficiently to overcome the hold violations which have not been overcome by the re-routing operation.

In some embodiments following these operations a freeze is applied to all the nets for hold fixed endpoints.

The tidying up operations, such as removing blockages, checking for further iterations, and freezing the routing of nets are shown in FIG. 2 by step 113.

In some embodiments the fixing of hold violations using blocking, de-routing and re-routing avoiding the block is performed on small hold violations only (for example fixing hold violations in the range 20 ps-30 ps). This can be justified as in such embodiments for big violations when the blockage size is too big then the re-routing tool can in some cases make the net very much longer than expected and thus creating transition/capacitance issues, also by increasing the total wire length of the design increasing potential cross talk issues.

Furthermore in such embodiments the other nets can be seen to be unaffected by the introduction of the blockage as only the affected net is re-routed (using selected net routing feature of backend tools) without creating any significant drc violations or shorts (and this is the reason why in some embodiments the net is not always detoured along the blockage periphery). Once this net is routed and the blockage removed an eco route is run on the design to clean violations where any exist as is described herein.

In such embodiments Default noise analysis (cross talk) is typically the last step after hold fixing so would not be required to be run again. DRC (design rule checking), LVS (layout verses schematic) checking running in a backend tool which uses abstracted models for cells and memories furthermore does not require significant time to finish. In a example simulation the time taken was 0.5 hrs. Furthermore in the same example the run time for three partitions on which this approach was tried were 6 hrs, 8 hrs, and 11 hrs. The runtime thus in some embodiments is clearly dependant on how many violations are targeted and how easy it is to reroute the design when running the re-routing or eco route. For example where the design has congestion the re-routing and eco route processing could take more time to run and vice-versa. One reason for easy convergence of this approach in embodiments of the application is that the designer can be provided with complete flexibility on which part of design or on which specific clk group, which (intellectual property) IP block, or over the complete design the embodiments of the application can be applied. For example the Designer may not want to use embodiments of the application in areas where only big hold violations exist (for the reasons discussed herein) or where specific areas have significant white space for buffer insertion.

Where designs are too congested to provide good results using embodiments of the application, in other words where a design is unable to incorporate even 12 µm detouring then such a design would also be problematic to fix even with conventional buffer approaches as, as described herein, the use of buffers generally increases the total wire length.

Although in the operations shown with respect to FIG. 2 the sequence of operations are to apply a derouting operation, to insert the routing blockage and then re-route the net it would be understood that the operations of inserting the routing blockage and the selective de-routing of violating nets can be implemented in either order as can be shown from the following examples.

Figure 3:
FIG. 3 shows an example of a small hold violation net routing.
Figure 4:
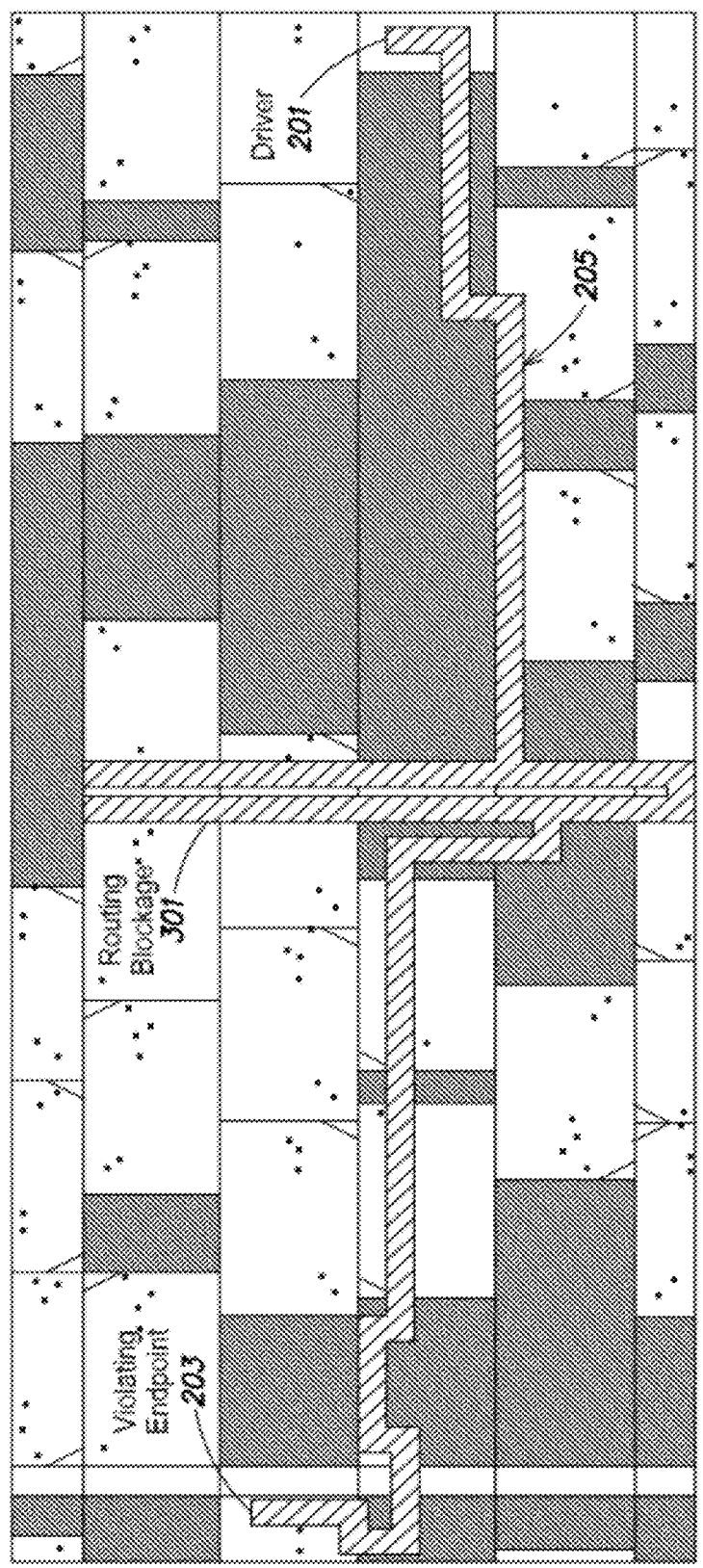
FIG. 4 shows an example of a small hold violation net routing with routing blockage shown according to some embodiments of the application.
Figure 5:
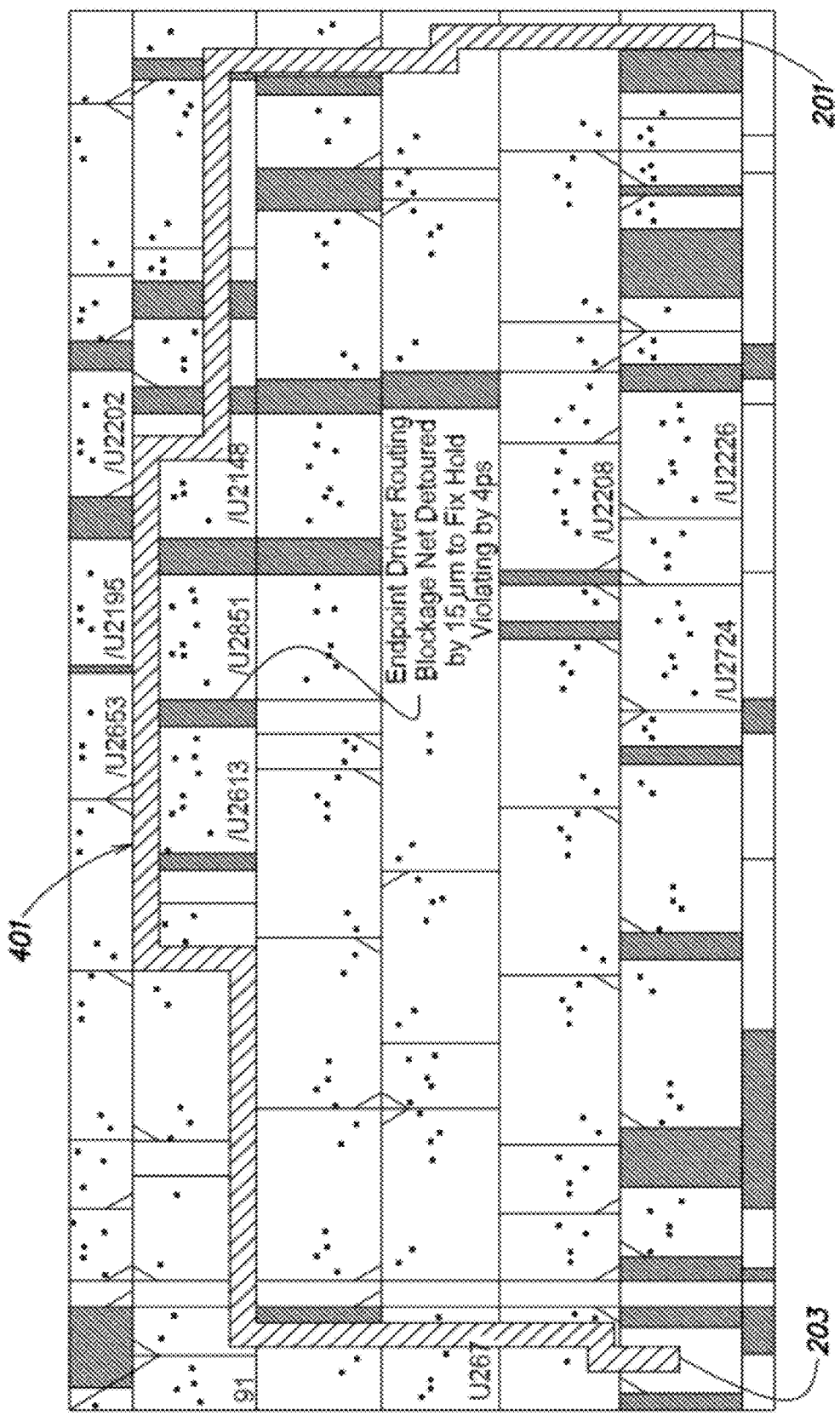
FIG. 5 shows an example of a re-routed net routing avoiding the routing blockage shown in FIG. 4 according to some embodiments.

With respect to FIGS. 3, 4 and 5, an example of the operation of re-routing is shown in further detail. FIG. 3, for example shows the result of an initial routing of a net 205 from a start point (a driver) 201 to a violating end point 203. The routing net 205 has in this example a hold time violation along the net 205 of 4 ps. FIG. 4 shows the application of a routing blockage 301 having been inserted between the driver 201 and end point 203. The routing blockage 301, a blockage with a single dimensionality of length, is shown in this embodiment having been inserted prior to the selective de-routing operation. FIG. 5 then shows the result of an initial de-routing operation followed by the re-routing detoured around the routing blockage. The re-routed net 401 is shown coupling the driver 201 and the end point 203 approximately 15 μm longer than the original net 205 which is sufficiently long enough to fix the hold violation of 4 ps.

With respect to FIGS. 6a and 6b, a further example of selective de-routing, blockage insertion, and selective re-routing is shown. In this example, as seen in FIG. 6a, the initial routing from the start point 503 to the end point 505 along the net 501 has a hold violation of approximately 3 ps. In this example, the topology of the net routing is configured to allow significant two-dimensional displacement in routing operations. Thus the routing blockage inserter 9 in this example is configured to implement a two-dimensional (with length and height) blockage 507 of the form of a pair of perpendicular lines as can be seen in FIG. 6b. The result of which the selective re-router 11 is configured to detour about the blockage 507 from the start position 503 to the end position 505 as shown by the re-routed net 511 with a length approximately 14 μlonger than the original net to overcomes the hold violation period.

A further example is shown in FIGS. 7a and 7b. In this example the initial net or first net 605 determined by the router 3 couples the start point 601 and the end point 603 and is determined to have a routing hold time violation. As seen in FIG. 7b the application of a routing blockage, and selective re-routing generates a re-routed net 607 between the start point 601 and end point 603 has a sufficient routing delay to overcome the hold violation.

The techniques described herein in embodiments of the application have been applied to a real life example of a set top box circuit design having 1.3M instances in 65 nm technology. In these examples a number of iterations (20) of selective de-routing blockage, and re-routing to target 67K hold violations across functional and scan shift modes. The run time to implement these operations was 5 hrs. After running these iterations for the real life example as not all hold violations were fixed by selective re-routing, the remaining hold violations were fixed using buffers.

The following tables show the improvements shown by the application of embodiments to the real lift circuit design example firstly targeting all hold violations in the range −30 ps to +20 ps.

TABLE 1

| Hold Before Fixing Functional Mode | |
|---|---|
| HOLD MODE | Reg2reg |
| WNS (ns) | −0.138 |
| TNS (ns) | −139.686 |
| Violating Paths | 8921 |
| All Paths | 5.11e+05 |

TABLE 3

| Hold Before Fixing Test Shift Mode | |
|---|---|
| HOLD MODE | Reg2reg |

TABLE 3-continued

| Hold Before Fixing Test Shift Mode | |
|---|---|
| WNS (ns) | −0.390 |
| TNS (ns) | −40.422 |
| Violating Paths | 2850 |
| All Paths | 2.96e+05 |

TABLE 2

| Hold After Fixing Functional Mode | |
|---|---|
| HOLD MODE | Reg2reg |
| WNS (ns) | −0.131 |
| TNS (ns) | −108.900 |
| Violating Paths | 7253 |
| All Paths | 5.11e+05 |

TABLE 4

| Hold After Fixing Test Shift Mode | |
|---|---|
| HOLD MODE | Reg2reg |
| WNS (ns) | −0.383 |
| TNS (ns) | −30.543 |
| Violating Paths | 1870 |
| All Paths | 2.96e+05 |

The total number of buffers saved after complete hold fixing were 17.3K. More importantly the setup time was much better compared to setup results after hold fixing using normal way by adding buffers.

As can be seen embodiments of the application can be operated on part of the design or any clock group also at any stage i.e. to target the violations before traditional hold fix by adding buffer or to fix violations from signoff.

From the results shown in table 1 and table 2 there is a fixing of 19% of Hold violations in functional mode keeping the worst negative slack (WNS) for hold preserved. Furthermore in such embodiments the total negative slack (TNS) value is reduced.

Similarly the results shown in table 3 and table 4 show a fixing of 35% of test shift mode paths for hold violations. Furthermore the WNS for Hold value is preserved, and the TNS value is reduced.

Furthermore by targeting all hold violation paths in the range from 0.0 ps to 20 ps and applying embodiments of the application the following results were found.

TOTAL PATHS FOR FIXING-->57550
TOTAL PATHS IMPROVED FOR TIMINGS-->48715
*TPS BEFORE SCAN DETOURING-->680.494
*TPS AFTER SCAN DETOURING-->996.67
PATH COMPLETELY FIXED AFTER DETORING--> 18799 (Slack>20 ps)
% OF FIXING DONE (HOLD IN ACCEPTABLE RANGE)-->33%

As this example aimed at targeting paths up to +20 ps total positive slack (TPS) was determined as well and it was expected that TPS after detouring would be greater than TPS before detouring.

In the simulation example it was noted that 57.5K violations were in the range 0-20 ps and from this 18.79K violations were fixed i.e. positive slack for these instances were made >20 ps using embodiments of the application. Furthermore there were out of the 57.5 k violations 19.78K violations in range 15 ps-20 ps i.e. in range of 5 ps, and out of these 13.3K were fixed using embodiments of the application (in other words an almost 68% fixing rate for the paths in this range). The remaining 6K violations were fixed in range 0-15 ps. In other words embodiments of the application can be shown to target and fix small violations where backend tools using traditional method would have inserted buffers and generating much more delay then actually required to fix these very small violations.

Furthermore the addition or insertion of buffers after detouring to target the remaining violations in the real-world circuit example generated the following results. The number of Buffers Added was 46675. The setup time after all hold fixes produced a WNS value of −1.9 ns, a TNS value of −11.446 ns and the number of violating paths remaining was 435 with no routing issues observed. Compared to the same example where hold fixing was carried out using buffers and without detouring required 63904 buffers to be added, a setup time after hold fix WNS value of −2.035 ns, a TNS value of −159.914 ns, and 2647 remaining violating paths.

Thus by the application of embodiments 27% of the total number of buffers can saved. Furthermore it can also be seen that the setup time in embodiments of the application are much better. This improvement to the setup time is unexpectedly because the reduction of the number of buffers used reduces the average net length required to couple the buffer to the start and end points and also each buffer inserted requires an additional net, one from the start to the buffer and the new inserted net from the buffer the endpoint.

In the embodiments shown herein another improvement over conventional design is that the overall design wire length is reduced which further leads to the design being more immune to crosstalk. The overall wire length in such designs is reduced as traditional approaches to fixing hold violations using buffers typically use a backend tool to try to insert the new added buffer in a white space or empty space in the design. The white space however may not be necessarily near to the violating endpoint, and so the new buffer being some distance away from violating endpoint thus causes the wire length to increase when compared to embodiments of the application. For example as described herein a gain of 0.8% less total wire length when hold violations were targeted using the detouring approaches of embodiments of the application and for remaining violations using additional buffers as the average detouring per net for fixing holds is 12 µm.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application can be implemented by computer software executable by a data processor, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such non-transitory physical storage media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable non-transitory data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

As used in this application, the term 'circuitry' can refer to hardware-only circuit implementations (such as implementations in only analog and/or digital circuitry) and to combinations of circuits and software (and/or firmware), such as: to a combination of processor(s) or (ii) to portions of processor(s)/software (including digital signal processor(s)), software, and memory(ies) that work together to cause an apparatus, such as a mobile phone or server, to perform various functions and to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware.

Whilst this detailed description has set forth some embodiments of the present invention, the appended claims cover other embodiments of the present application which differ from the described embodiments according to various modifications and improvements. Other applications and configurations may be apparent to the person skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for routing in an electronic circuit, the method comprising:

determining, by using at least one processor, at least one hold violation in a net routing in the electronic circuit, the at least one hold violation comprising a time delay in transmission of data in a first path between a start point and an end point in the net routing after a clock transition;

inserting a routing blockage associated with the at least one hold violation by defining a boundary between the start point and the end point, the boundary defining an area within which no routing path from the start point to the end point is allowed in the net routing;

de-routing the net routing to remove the first path in the net routing between the start point and the end point associated with the at least one hold violation; and re-routing the net routing to detour around the routing blockage so that the start point and the end point are connected via a second path in the net routing, wherein the second path is longer than the first path.

2. The method as claimed in claim 1, wherein inserting the routing blockage comprises one or more of:

inserting a fixed dimension routing blockage;

inserting a routing blockage with dimensions dependent on a timing of the at least one hold violation;

inserting a routing blockage dependent on information about a topology of the net routing; and inserting a routing blockage dependent on information about a net routing technology.

3. The method as claimed in claim 2, wherein determining the at least one hold violation in the net routing comprises determining a small hold violation in the net routing.

4. The method as claimed in claim 3, wherein the small hold violation is one or more of:

a 0-20 ps hold violation; and a 20-30 ps hold violation.

5. The method as claimed in claim 1, wherein inserting a routing blockage comprises inserting a routing blockage with length and width dimensions.

6. The method as claimed in claim 1, further comprising:

determining a potential routing blockage location for the routing blockage;

determining that the routing blockage at the potential routing blockage location has a minimum distance from at least one other routing blockage at a second potential routing blockage location; and associating the potential routing blockage location with the routing blockage.

7. The method as claimed in claim 1, further comprising removing the routing blockage after re-routing the net routing.

8. The method as claimed in claim 1, further comprising:

determining at least one secondary hold violation in the net routing after re-routing the net routing.

9. The method as claimed in claim 8, further comprising:

inserting a secondary routing blockage associated with each of the at least one secondary hold violation, wherein the secondary routing blockage has dimensions greater than the routing blockage associated with the net routing;

de-routing the determined net routing; and re-routing the net routing dependent on at least the secondary routing blockage.

10. The method as claimed in claim 8, further comprising inserting a timing buffer in a net routing pathway of the secondary hold violation.

11. A computing device comprising a processor configured to execute computer-executable instructions to cause the computing device to implement:

a routing analyzer configured to determine at least one hold violation in a net routing in an electronic circuit, the at least one hold violation comprising a time delay in transmission of data in a first path between a start point and an end point in the net routing after a clock transition;

a routing inserter configured to insert a routing blockage associated with the at least one hold violation by defining a boundary between the start point and the end point, the boundary defining an area within which no routing path from the start point to the end point is allowed in the net routing;

a routing deleter configured to de-route the net routing to remove the first path in the net routing between the start point and the end point associated with the at least one hold violation; and a router configured to re-route the net routing to detour around the routing blockage so that the start point and the end point are connected via a second path in the net routing, wherein the second path is longer than the first path.

12. The computing device as claimed in claim 11, wherein the routing inserter comprises one or more of:

a fixed dimension routing inserter configured to insert a fixed dimension routing blockage;

a variable dimension routing inserter configured to insert a routing blockage with dimensions dependent on a timing of the at least one hold violation;

a topology dependent routing inserter configured to insert the routing blockage dependent on information about a topology of the net routing; and a technology dependent routing inserter configured to insert a routing blockage dependent on information about a net routing technology.

13. The computing device as claimed in claim 12, wherein the routing analyzer comprises a small hold violation determiner configured to determine a small hold violation in a net routing.

14. The computing device as claimed in claim 13, wherein the small hold violation is one or more of:

a 0-20 ps hold violation; and a 20-30 ps hold violation.

15. The computing device as claimed in claim 11, wherein the routing inserter is configured to insert a routing blockage with at least length and width dimensions.

16. The computing device as claimed in claim 11, further comprising:

a routing insert locator configured to determine a potential routing blockage location for the routing blockage;

a routing insert proximity detector configured to determine the routing blockage at the potential routing blockage location that has a minimum distance from at least one other routing blockage at a second potential routing blockage location; and a routing insert linker configured to associate the potential routing blockage location with the routing blockage.

17. The computing device as claimed in claim 11, further comprising a routing blockage remover configured to remove the routing blockage after re-routing the net routing.

18. The computing device as claimed in claim 11, wherein the routing analyzer is further configured to determine at least one secondary hold violation in a net routing after re-routing the net routing.

19. The computing device as claimed in claim 18, wherein:

the routing inserter is further configured to insert a secondary routing blockage associated with each of the at least one secondary hold violation, wherein the secondary routing blockage has dimensions greater than the routing blockage associated with the net routing;

the routing deleter is further configured to de-route the determined net routing; and the router is further configured to re-route the net routing dependent on at least the secondary routing blockage.

20. The computing device as claimed in claim 18, further comprising a buffer inserter configured to insert a timing buffer in a net routing of the secondary hold violation.

21. At least one computer-readable medium encoded with computer-executable instructions that, when executed by at least one processor, cause the at least one processor to:
   determine at least one hold violation in a net routing in an electronic circuit, the at least one hold violation comprising a time delay in transmission of data in a first path between a start point and an end point in the net routing after a clock transition;
   insert a routing blockage associated with the at least one hold violation by defining a boundary between the start point and the end point, the boundary defining an area within which no routing path from the start point to the end point is allowed in the net routing;
   de-route the net routing to remove the first path in the net routing between the start point and the end point associated with the at least one hold violation; and
   re-route the net routing to detour around the routing blockage so that the start point and the end point are connected via a second path in the net routing, wherein the second path is longer than the first path.

22. The at least one computer-readable medium as claimed in claim 21, wherein the routing blockage comprises one or more of a fixed dimension routing blockage, a routing blockage with dimensions dependent on a timing of the at least one hold violation, a routing blockage dependent on information about a topology of the net routing, and a routing blockage dependent on information about a net routing technology.

23. The at least one computer-readable medium as claimed in claim 22, wherein the at least one hold violation in the net routing comprises a small hold violation in the net routing.

24. The at least one computer-readable medium as claimed in claim 23, wherein the small hold violation comprises one or more of a 0-20 ps hold violation and a 20-30 ps hold violation.

25. The at least one computer-readable medium as claimed in claim 21, wherein the routing blockage comprises a routing blockage with length and width dimensions.

26. The at least one computer-readable medium as claimed in claim 21, wherein the computer-executable instructions, when executed by the at least one processor, further cause the at least one processor to:
   determine a potential routing blockage location for the routing blockage;
   determine that the routing blockage at the potential routing blockage location has a minimum distance from at least one other routing blockage at a second potential routing blockage location; and
   associate the potential routing blockage location with the routing blockage.

27. The at least one computer-readable medium as claimed in claim 21, wherein the computer-executable instructions, when executed by the at least one processor, further cause the at least one processor to:
   remove the routing blockage after re-routing the net routing.

28. The at least one computer-readable medium as claimed in claim 21, wherein the computer-executable instructions, when executed by the at least one processor, further cause the at least one processor to:
   determine at least one secondary hold violation in the net routing after re-routing the net routing.

29. The at least one computer-readable medium as claimed in claim 28, wherein the computer-executable instructions, when executed by the at least one processor, further cause the at least one processor to:
   insert a secondary routing blockage associated with each of the at least one secondary hold violation, wherein the secondary routing blockage has dimensions greater than the routing blockage associated with the net routing;
   de-route the determined net routing; and
   re-route the net routing dependent on at least the secondary routing blockage.

30. The at least one computer-readable medium as claimed in claim 28, wherein the computer-executable instructions, when executed by the at least one processor, further cause the at least one processor to:
   insert a timing buffer in a net routing pathway of the secondary hold violation.

31. A method for fixing hold time violations in an electronic circuit, the method comprising:
   executing at least one processor to:
      determine at least one hold violation in a net routing in the electronic circuit, the at least one hold violation comprising a time delay in transmission of data in a first path between a start point and an end point in the net routing after a clock transition;
      insert a routing blockage associated with the at least one hold violation by defining a boundary between the start point and the end point, the boundary defining an area within which no routing path from the start point to the end point is allowed in the net routing;
      de-route the net routing to remove the first path in the net routing between the start point and the end point associated with the at least one hold violation; and
      re-route the net routing to detour around the routing blockage so that the start point and the end point are connected via a second path in the net routing, wherein the second path is longer than the first path.

32. The method as claimed in claim 31, wherein inserting the routing blockage comprises one or more of:
   inserting a fixed dimension routing blockage;
   inserting a routing blockage with dimensions dependent on a timing of the at least one hold violation;
   inserting a routing blockage dependent on information about a topology of the net routing; and
   inserting a routing blockage dependent on information about a net routing technology.

33. The method as claimed in claim 32, wherein determining the at least one hold violation in the net routing comprises determining a hold violation in the net routing comprising one or more of a 0-20 ps hold violation and a 20-30 ps hold violation.

34. The method as claimed in claim 31, wherein inserting a routing blockage comprises inserting a routing blockage with length and width dimensions.

35. The method as claimed in claim 31, further comprising:
   determining a potential routing blockage location for the routing blockage;
   determining that the routing blockage at the potential routing blockage location has a minimum distance from at least one other routing blockage at a second potential routing blockage location; and
   associating the potential routing blockage location with the routing blockage.

36. The method as claimed in claim 31, further comprising:
   removing the routing blockage after re-routing the net routing.

37. The method as claimed in claim 31, further comprising: determining at least one secondary hold violation the net routing after re-routing the net routing.

38. The method as claimed in claim 37, further comprising:
inserting a secondary routing blockage associated with each of the at least one secondary hold violation, wherein the secondary routing blockage has dimensions greater than the routing blockage associated with the net routing;
de-routing the determined net routing; and
re-routing the net routing dependent on at least the secondary routing blockage.

39. The method as claimed in claim 37, further comprising inserting a timing buffer in a net routing pathway of the secondary hold violation.

* * * * *